United States Patent
Park et al.

(10) Patent No.: US 9,859,014 B2
(45) Date of Patent: Jan. 2, 2018

(54) SEMICONDUCTOR MEMORY DEVICE INCLUDING MULTI-LEVEL CELL AND PROGRAMMING METHOD THEREOF

(71) Applicant: SK hynix Inc., Icheon-si, Gyeonggi-do (KR)

(72) Inventors: Min Sang Park, Cheongju-si (KR); Sung Ho Kim, Cheongju-si (KR); Kyong Taek Lee, Sejong-si (KR); Yun Bong Lee, Cheongju-si (KR); Gil Bok Choi, Daejeon (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/212,559

(22) Filed: Jul. 18, 2016

(65) Prior Publication Data

US 2017/0229189 A1 Aug. 10, 2017

(30) Foreign Application Priority Data

Feb. 4, 2016 (KR) .................. 10-2016-0014273

(51) Int. Cl.
*G11C 16/34* (2006.01)
*G11C 16/10* (2006.01)

(52) U.S. Cl.
CPC .......... *G11C 16/3459* (2013.01); *G11C 16/10* (2013.01)

(58) Field of Classification Search
CPC ............................ G11C 16/3459; G11C 16/10
USPC ........................................ 365/185.12, 3, 11
See application file for complete search history.

(56) References Cited

U.S. PATENT DOCUMENTS

| 7,684,255 B2 * | 3/2010 | Kim ...................... G11C 16/26 365/185.03 |
| 2006/0203544 A1 * | 9/2006 | Visconti .............. G11C 11/5628 365/185.02 |
| 2008/0106944 A1 * | 5/2008 | Kim ...................... G11C 16/10 365/185.19 |
| 2008/0165579 A1 * | 7/2008 | Lee ..................... G11C 11/5628 365/185.03 |
| 2009/0016104 A1 * | 1/2009 | Kim ................... G11C 11/5628 365/185.03 |
| 2010/0027348 A1 * | 2/2010 | Kim ...................... G11C 16/10 365/185.19 |

(Continued)

FOREIGN PATENT DOCUMENTS

| KR | 1020100138540 A | 12/2010 |
| KR | 1020150000572 A | 1/2015 |

*Primary Examiner* — Vu Le
*Assistant Examiner* — Sung Cho
(74) *Attorney, Agent, or Firm* — William Park & Associates Ltd.

(57) ABSTRACT

There are provided a semiconductor memory device and an operating method thereof. A semiconductor memory device may include a memory cell array, a peripheral circuit, a control logic, and one or more programs. The memory cell array may include a plurality of memory cells. The peripheral circuit may perform a program operation on the memory cell array. The control logic may control the peripheral circuit to program the memory cell array. The one or more programs are configured to be executed by the control logic. The programs may include an instruction for pre-programming one or more memory cells to be programmed to one or more target program states to have threshold voltage distributions lower than the target program state.

20 Claims, 9 Drawing Sheets

(56) References Cited

U.S. PATENT DOCUMENTS

| | | | | |
|---|---|---|---|---|
| 2010/0302864 A1* | 12/2010 | Kim | ............... | G11C 16/04 |
| | | | | 365/185.22 |
| 2010/0321998 A1* | 12/2010 | Jang | ............... | G11C 11/5628 |
| | | | | 365/185.03 |
| 2011/0085379 A1* | 4/2011 | Kim | ............... | G11C 11/5628 |
| | | | | 365/185.03 |
| 2011/0131367 A1* | 6/2011 | Park | ............... | G06F 12/0246 |
| | | | | 711/103 |
| 2011/0194346 A1* | 8/2011 | Yoon | ............... | G11C 16/3454 |
| | | | | 365/185.03 |
| 2011/0292724 A1* | 12/2011 | Kim | ............... | G11C 16/0483 |
| | | | | 365/185.03 |
| 2011/0296087 A1* | 12/2011 | Kim | ............... | G06F 12/0246 |
| | | | | 711/103 |
| 2012/0044769 A1* | 2/2012 | Yip | ............... | G11C 11/5628 |
| | | | | 365/185.19 |
| 2012/0069677 A1* | 3/2012 | Lee | ............... | G11C 16/0483 |
| | | | | 365/185.22 |
| 2013/0279260 A1* | 10/2013 | Yoon | ............... | G11C 16/0483 |
| | | | | 365/185.18 |
| 2013/0279265 A1* | 10/2013 | Lee | ............... | G11C 16/16 |
| | | | | 365/185.24 |
| 2013/0301352 A1* | 11/2013 | Shim | ............... | G11C 16/10 |
| | | | | 365/185.03 |
| 2014/0211565 A1* | 7/2014 | Song | ............... | G11C 11/5628 |
| | | | | 365/185.03 |

* cited by examiner

SEMICONDUCTOR MEMORY DEVICE INCLUDING MULTI-LEVEL CELL AND PROGRAMMING METHOD THEREOF

CROSS-REFERENCE TO RELATED APPLICATION

The present application claims priority under 35 U.S.C. §119(a) to Korean patent application number 10-2016-0014273 filed on Feb. 4, 2016 in the Korean Intellectual Property Office, the entire disclosure of which is incorporated herein by reference.

BACKGROUND

1. Technical Field

An aspect of the present disclosure generally relates to an electronic device, and more particularly to a semiconductor memory device and an operating method thereof.

2. Related Art

Semiconductor devices may be manufactured as integrated circuits. Semiconductor memory devices are data storage devices implemented on the integrated circuit. The semiconductor memory devices are generally classified into volatile memory devices and nonvolatile memory devices.

A non-volatile memory device performs a read/write operation at a relatively low speed, but retains stored data even in the event of loss of power supply. Accordingly, the non-volatile memory device may be used for the task of secondary storage, which does not lose the data when the device is powered down. Examples of the non-volatile memory device may include a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), and the like. Flash memories may be classified into NOR type flash memories and NAND type flash memories.

Like a random access memory (RAM), the flash memories can be written and erased multiple times, and like the ROM, the flash memory can retain its data even when it is powered down. The flash memories are widely used as a storage medium of portable electronic devices such as a digital camera, a smartphone, a personal digital assistant (PDA), and an MP3 player.

SUMMARY

According to an aspect of the present disclosure, a semiconductor memory device may include a memory cell array, a peripheral circuit, a control logic, and one or more programs. The memory cell array may include a plurality of memory cells. The peripheral circuit may perform a program operation on the memory cell array. The control logic may control the peripheral circuit to program the memory cell array. The one or more programs are configured to be executed by the control logic. The programs may include an instruction for pre-programming one or more memory cells to be programmed to one or more target program states of which threshold voltage distribution characteristics are weak to have threshold voltage distributions lower than the target program state. The programs may include an instruction for programming the other memory cells except the one or more memory cells to one or more other target program states in a normal program method. The programs may include an instruction for re-programming the one or more memory cells to the target program state.

According to an aspect of the present disclosure, there is provided a method of operating a semiconductor memory device. The method of operating a semiconductor memory device may include providing a page including a plurality of memory cells. The method may include pre-programming one or more memory cells to be programmed to one or more target program states of which threshold voltage distribution characteristics are weak threshold voltages each lower than each of the one or more target program states. The method may include programming the other memory cells except the one or more memory cells to one or more other program states except the one or more target program state. The method may include programming the one or more memory cells to the one or more target program states.

According to an aspect of the present disclosure, there is provided a method of operating a semiconductor memory device. The method may include providing a plurality of pages each including a plurality of memory cells. The method may include pre-programming one or more memory cells to be programmed to one or more program states of which threshold voltage distribution characteristics are weak in a program operation of predetermined pages, among the plurality of pages, to have threshold voltage distributions each lower than each of the one or more target program states. The method may include programming the other memory cells except the one or more memory cells to one or more other target program states except the one or more target program state. The method may include programming the one or more memory cells to the one or more target program states.

DETAILED DESCRIPTION

Figure 1:
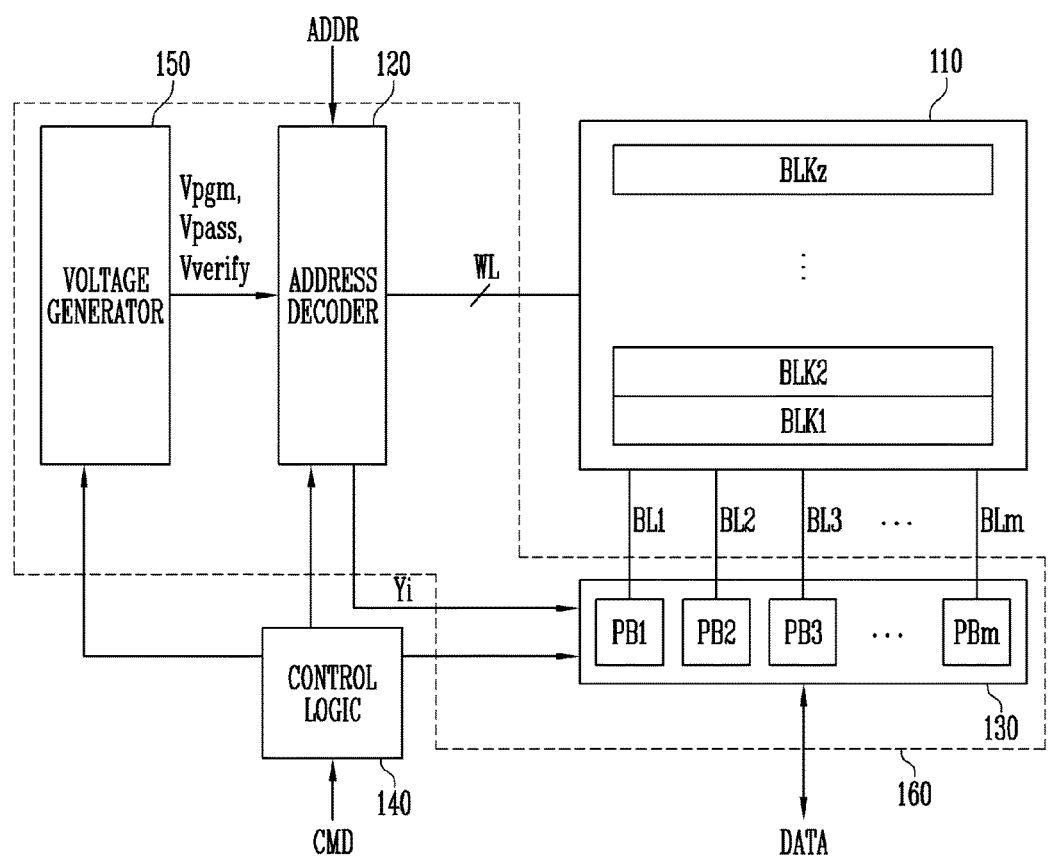
FIG. 1 is a diagram illustrating an example of a semiconductor memory device according to an embodiment of the present disclosure.

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

In the following detailed description, only certain exemplary embodiments of the present disclosure have been shown and described, simply by way of illustration. As those skilled in the art would realize, the described embodiments may be modified in various different ways, all without departing from the spirit or scope of the present disclosure.

Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

FIG. 1 is a diagram illustrating an example of a semiconductor memory device according to an embodiment of the present disclosure.

Referring to FIG. 1, the semiconductor memory device 100 may include a memory cell array 110, an address decoder 120, a read/write circuit 130, a control logic 140, and a voltage generator 150.

The address decoder 120, the read/write circuit 130, and the voltage generator 150 may be defined as a peripheral circuit 160 that performs a program operation on the memory cell array 110.

Memory cells of the semiconductor memory device 100 may be arranged in the memory cell array 100. The memory cells of the memory cell array 110 may be grouped into a plurality of memory blocks BLK1 to BLKz. The plurality of memory blocks BLK1 to BLKz may be coupled to the address decoder 120 through word lines WL, and may be coupled to the read/write circuit 130 through bit lines BL1 to BLm. In an embodiment, the plurality of memory cells may be nonvolatile memory cells. Memory cells coupled to the same word line, among the plurality of memory cells, may be defined as one page. That is, the memory cell array 110 may be configured with a plurality of pages.

Each of the memory blocks BLK1 to BLKz of the memory cell array 110 may include a plurality of memory strings. Each of the memory strings may include a drain select transistor, a plurality of memory cells, and a source select transistor, which are coupled in series between a bit line and a source line. Detailed descriptions of the memory cell array 110 will be described later.

The address decoder 120 may be coupled to the memory cell array 110 through the word lines WL. The address decoder 120 may operate in response to control signals of the control logic 140. The address decoder 120 may select one or more word lines WL in response to an address ADDR provided through an input/output buffer (not illustrated) of the semiconductor memory device 100.

The address ADDR may include a row address that is used to select rows of the memory cell array 100. The address decoder 120 may decode the row address to apply, during a program operation, a plurality of operation voltages including a program voltage Vpgm or a verify voltage Vverify and a pass voltage Vpass, which are generated by the voltage generator 150, to the plurality of memory cells and the drain and source select transistors in the memory cell array 110 according to the decoded row address.

The address ADDR may also include a column address that is used to select columns of the memory cell array 100. The address decoder 120 may also decode the column address in the program operation. The address decoder 120 may transmit the decoded column address Yi to the read/write circuit 130.

The address ADDR provided during the program operation may include a block address, a row address, and a column address. The address decoder 120 may select a memory block and a word line according to the block address and the row address. The column address may be decoded by the address decoder 120 to be provided to the read/write circuit 130.

The address decoder 120 may include a block decoder, a row decoder, a column decoder, an address buffer, and the like.

The read/write circuit 130 may include a plurality of page buffers PB1 to PBm. The plurality of page buffers PB1 to PBm may be coupled to the memory cell array 110 through the bit lines BL1 to BLm. For example, the plurality of page buffers PB1 to PBm may include latches for storing data DATA transferred to/from the memory cell array 100 and sense amplifiers for sensing the bit lines BL1 to BLm during a read operation or during a program verification operation. During the program operation, the data DATA to be programmed may be transferred to the plurality of page buffers PB1 to PBm, and bit-line potentials of the bit lines BL1 to BLm may be determined depending on the data DATA stored in the plurality of page buffers PB1 to PBm. In addition, the plurality of page buffers PB1 to PBm may perform a program verification operation by sensing the bit-line potentials or the amount of bit-line current flowing through bit lines BL1 to BLm.

The read/write circuit 130 may operate in response to control signals of the control logic 140.

In an embodiment, the read/write circuit 130 may include page buffers (or page registers), a column select circuit, and the like.

The control logic 140 may be coupled to the address decoder 120, the read/write circuit 130, and the voltage generator 150. The control logic 140 may receive a command CMD through the input/output buffer (not illustrated) of the semiconductor memory device 100. The control logic 140 may control overall operations of the semiconductor memory device 100 in response to the command CMD.

A memory cell that can store more than one bit per cell may have four or more program states (e.g., threshold voltage distributions).

One or more of those program states may be vulnerable threshold voltage distributions (hereinafter referred to as "vulnerable program state"). According to an embodiment of the present disclosure, the control logic 140 may control the peripheral circuit 160 such that one or more memory cells to be programmed to the vulnerable program state are programmed using a re-program method. Also, the control logic 140 may control the peripheral circuit 160 to program the other memory cells using a normal program method.

In the re-program method, a pre-program operation may be performed on selected memory cells such that those memory cells are programmed to have threshold voltages lower than a target threshold voltage, and then, after program operations of the other memory cells are completed, a re-program operation may be performed on the selected memory cells so that they have threshold voltages equal to or greater than the target threshold voltage.

According to an embodiment of the present disclosure, the control logic 140 may control the peripheral circuit 160 to program, using the re-program method, memory cells to be programmed to the vulnerable program state among memory cells included in a predetermined page among a plurality of pages included in a selected memory block. The predetermined page may be one or more pages of which threshold voltage distribution characteristics are weak. For example, the predetermined page may be a page that includes memory cells adjacent to the drain select transistor, or may be a page that includes memory cells adjacent to the source select transistor. Also, the predetermined pages may be a plurality of pages having memory cells adjacent to the drain select transistor and a plurality of pages having memory cells adjacent to the source select transistor.

The voltage generator 150 may generate and output operation voltages including the program voltage Vpgm, the pass voltage Vpass, the verify voltage, and the like under control of the control logic 140 in the program operation.

Figure 2:
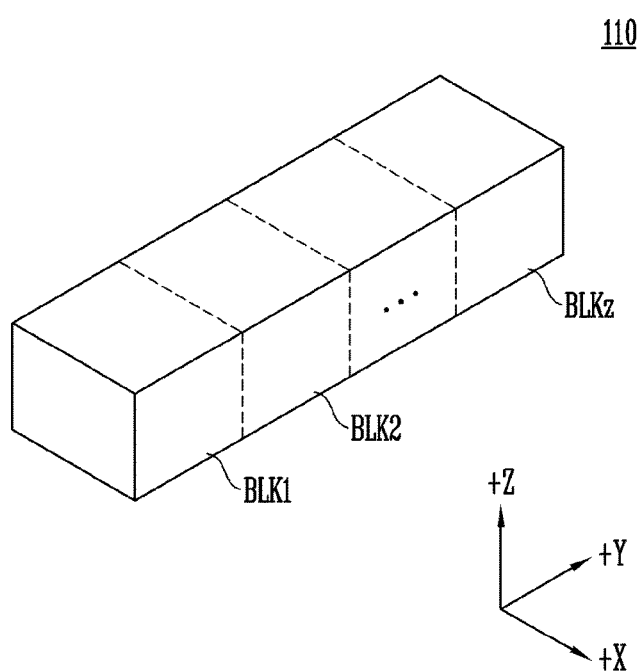
FIG. 2 is a diagram illustrating an example of a memory cell array of FIG. 1.

FIG. 2 is a diagram illustrating an example of the memory cell array of FIG. 1.

Referring to FIG. 2, the memory cell array 110 may include a plurality of memory blocks BLK1 to BLKz. Each memory block has a three-dimensional structure. Each memory block may include a plurality of memory cells stacked on a substrate. The plurality of memory cells may be arranged along +X, +Y, and +Z directions. The structure of each memory block will be described in detail with reference to FIG. 3.

Figure 3:
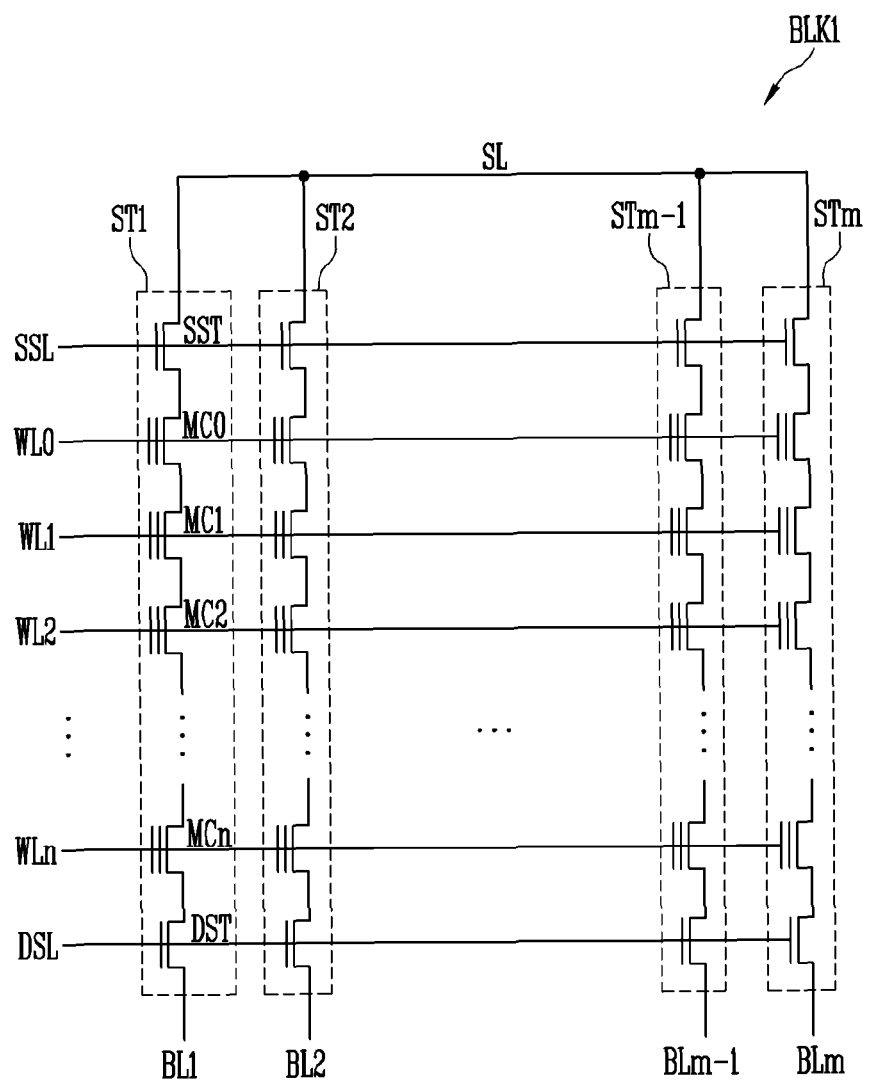
FIG. 3 is a diagram illustrating an example of a memory block of FIG. 1.

FIG. 3 is a diagram illustrating an example of a memory block of FIG. 1.

Referring to FIG. 3, the memory block BLK1 may include a plurality of cell strings ST1 to STm. Each of the plurality of cell strings ST1 to STm may be coupled to one of a plurality of bit lines BL1 to BLm.

Each of the memory strings ST1 to STm may include a source select transistor SST, a plurality of memory cells MC0 to MCn coupled in series to each other, and a drain select transistor DST. The source select transistor SST may be coupled to a source select line SSL. The plurality of memory cells MC0 to MCn may be coupled to word lines WL0 to WLn, respectively. The drain select transistor DST is coupled to a drain select line DSL. A source line SL may be coupled to a source of the source select transistor SST. Each of the bit lines BL1 to BLm may be coupled to a drain of a corresponding drain select transistor DST. The plurality of word lines described with reference to FIG. 1 may include the source select line SSL, the word lines WL0 to WLn, and the drain select line DSL. The source select line SSL, the word lines WL0 to WLn, and the drain select line DSL may be driven by the address decoder 120.

According to an embodiment of the present disclosure, in a program operation of the memory block BLK1, memory cells to be programmed to the vulnerable program state, among the plurality of memory cells MC0 to MCn included in each of the plurality of memory strings ST1 to STm may be programmed using the re-program method.

According to an embodiment of the present disclosure, in the program operation of the memory block BLK1, if memory cells (e.g. MC0) included in pages corresponding to at least one word line (e.g., WL0) adjacent to the drain select line DSL are supposed to be programmed to the vulnerable program state, those memory cells (e.g. MC0) may be programmed using the re-program method. Alternatively, if memory cells (e.g., MC0 and MCn) included in pages corresponding to word lines respectively adjacent to the drain select line DSL and the source select line SSL are supposed to be programmed to the vulnerable program state, those memory cells (e.g., WL0 and WLn) may be programmed using the re-program method, and the other memory cells may be programmed using the normal program method.

Figure 4:
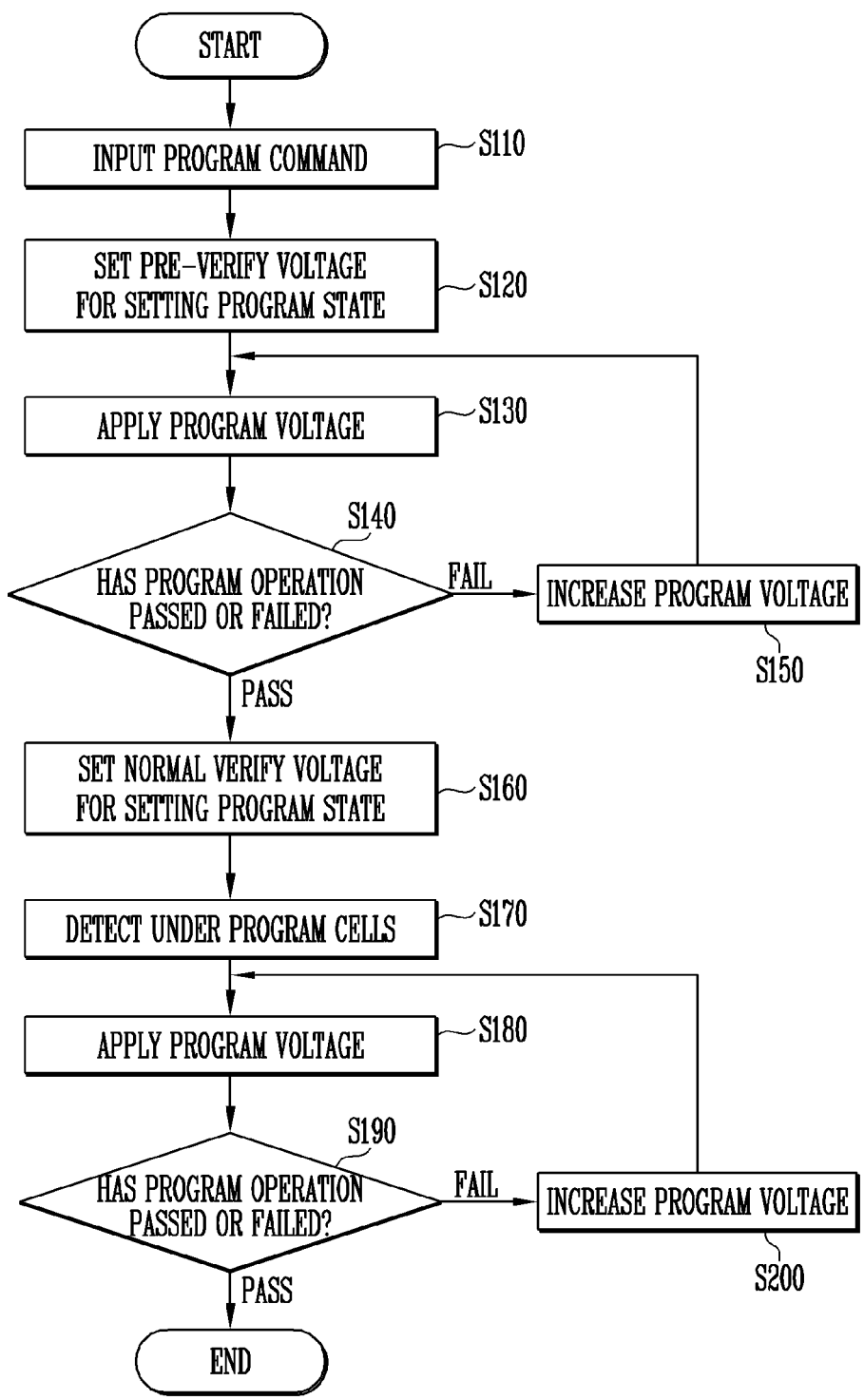
FIG. 4 is a flowchart illustrating an example of an operating method of the semiconductor memory device according to an embodiment of the present disclosure.

FIG. 4 is a flowchart illustrating an example of an operating method of the semiconductor memory device according to an embodiment of the present disclosure.

Figure 5:
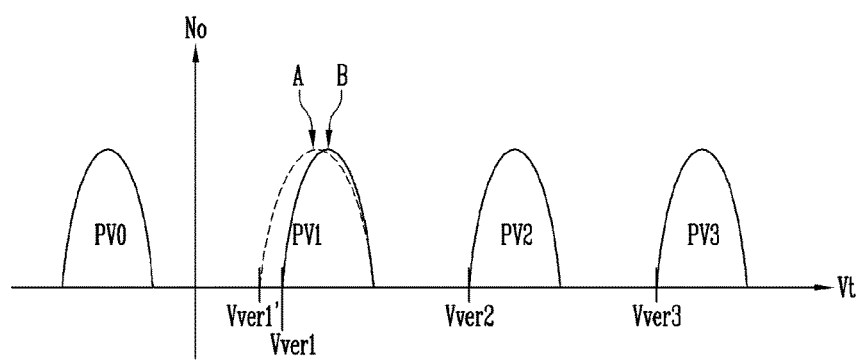
FIG. 5 is a graph illustrating threshold voltage distributions of memory cells in the operating method according to an embodiment of the present disclosure.

FIG. 5 is a graph illustrating threshold voltage distributions of memory cells in the operating method according to an embodiment of the present disclosure.

An operating method of the semiconductor memory device according to an embodiment of the present disclosure will be described as follows with reference to FIGS. 1 to 5.

In an embodiment of the present disclosure, it is assumed that data is programmed in a multi level cell (MLC) (i.e., it is assumed that a multi level cell programming method is used). However, the present disclosure is not limited thereto, and various embodiments of the present disclosure may be applied to program operations with respect to a triple level cell (TLC) and a quad level cell (QLC).

If a command CMD for a program operation is input from an external device (S110), the control logic 140 may control the peripheral circuit to perform the program operation of the semiconductor memory device. The read/write circuit 130 temporarily stores data DATA to be programmed, which is input from the external device.

The control logic 140 may perform a re-program operation with respect to at least one program state (e.g., the vulnerable program state), among a plurality of program states, and may control the peripheral circuit to perform a normal program operation with respect to the other program states. The control logic 140 may control the voltage generator 150 to set a program pre-verify voltage for the program state subject to the re-program operation (S120).

Referring to FIG. 5, a multi level cell (MLC) may be programmed to have one of a plurality of threshold voltage distributions PV0 to PV3 in the program operation. For example, a first threshold voltage distribution PV0 is an erase state, and second to fourth threshold voltage distributions PV1 to PV3 are program states (e.g., first to third program states). The program operation performed to program memory cells to the first program state PV1 having the lowest threshold voltage distribution may be completed before the completion of program operations of any other the program states PV2 to PV3. As a result, the threshold voltage distribution of the first program state PV1 may unintentionally change during the program operation performed to program memory cells to the other program states PV2 and PV3. Therefore, in an embodiment of the present disclosure, the first program state PV1, which is a vulnerable threshold voltage distribution, may be set as the vulnerable program state, and a pre-verify voltage Vver1' may be set with respect to memory cells to be programmed to the program state PV1. The pre-verify voltage Vver1' may be set at a lower voltage level than a normal verify voltage Vver1 having the same level as a target threshold voltage.

In an embodiment of the present disclosure, the program state PV1 may be set as the vulnerable program state, but the present disclosure is not limited thereto. That is, two or more program states, among the program states PV1 to PV3, may be vulnerable threshold voltage distributions, and may be set as the vulnerable program state, and pre-verify voltages may be set to verify whether threshold voltages of target memory cells have been reached predetermined threshold voltages lower than target threshold voltages.

The voltage generator 150 may generate a program voltage Vpgm to be applied to a selected word line and a pass voltage Vpass to be applied to the other word lines (i.e., unselected word lines). The address decoder 120 may apply the program voltage Vpgm to the selected word line and the pass voltage Vpass to the unselected word lines (S130).

The plurality of page buffers PB1 to PBm of the read/write circuit 130 may perform a program verification operation (S140) to verify whether the program operation of each memory cell coupled to the selected word line has been completed. At this time, a pre-verify voltage Vver1' and normal verify voltages Vver2 and Vver3 may be sequentially applied to the selected word line, and the plurality of page buffers PB1 to PBm may perform the program verification operation by sensing the bit-line potentials or the amount of bit-line current when the pre-verify voltage Vver1' and the normal verify voltages Vver2 and Vver3 are applied to measure a threshold voltage of each memory cell.

When it is determined that the program operation of at least one memory cell, among the memory cells coupled to the selected word line, has failed, the program voltage may be increased by a step voltage (S150), and the processes discussed above may be re-performed from the application of the program voltage (S130).

Accordingly, memory cells to be programmed to the first program state PV1 among the memory cells coupled to the selected word line may be programmed to have threshold voltage distribution A.

Subsequently, a program operation may be performed to program memory cells to the second and third program states (i.e., PV2 and PV3).

When it is determined that the program operations of all the memory cells coupled to the selected word line have passed their program verifications using the pre-verify voltage Vver1' and the normal verify voltages Vver2 and Vver3, the control logic 140 may set a normal verify voltage Vver1 for the first program state PV1 (S160).

Subsequently, memory cells having threshold voltages lower than the normal verify voltage Vver1, among the memory cells to be programmed to the first program state PV1, may be detected (S170).

This operation may be a program verification operation that is performed by using the normal verify voltage Vver1. That is, memory cells having threshold voltages lower than the normal verify voltage Vver1 may be detected by sensing current or voltage levels of the bit lines BL1 to BLm coupled to the memory cells using the plurality of page buffers PB1 to PBm when the normal verify voltage Vver1 is applied to a word line of a selected page, and a program permission voltage is applied to bit lines coupled to the detected memory cells when another program pulse is applied thereto. At that time, a program prohibition voltage may be applied to bit lines coupled to memory cells having threshold voltages equal to or higher than the normal verify voltage Vver1 to inhibit them from programming.

The voltage generator 150 may generate a program voltage Vpgm to be applied to the selected word line and a pass voltage Vpass to be applied to the unselected word lines. The address decoder 120 may apply the program voltage Vpgm to the selected word line and the pass voltage Vpass to the unselected word lines (S180).

Subsequently, a program verification operation may be performed on memory cells to be programmed to the first program state using the normal verify voltage Vver1 (S190). When it is determined that the program operations of memory cells to be programmed to the first program state have failed their program verifications using the normal verify voltage Vver1, the program voltage may be increased by a step voltage (S200), and the processes discussed above may be re-performed from the application of the program voltage (S180). Accordingly, the memory cells to be programmed to the first program state PV1 may be programmed to have threshold voltage distribution B. That is, the width of the threshold voltage distributions of the memory cells to be programmed to the first program state may be narrowed from A to B.

As described above, in an embodiment of the present disclosure, the re-program operation may be performed with respect to a program state that is a vulnerable threshold voltage distribution in the subsequent program operation, thereby improving threshold voltage distributions of memory cells.

Figure 6:
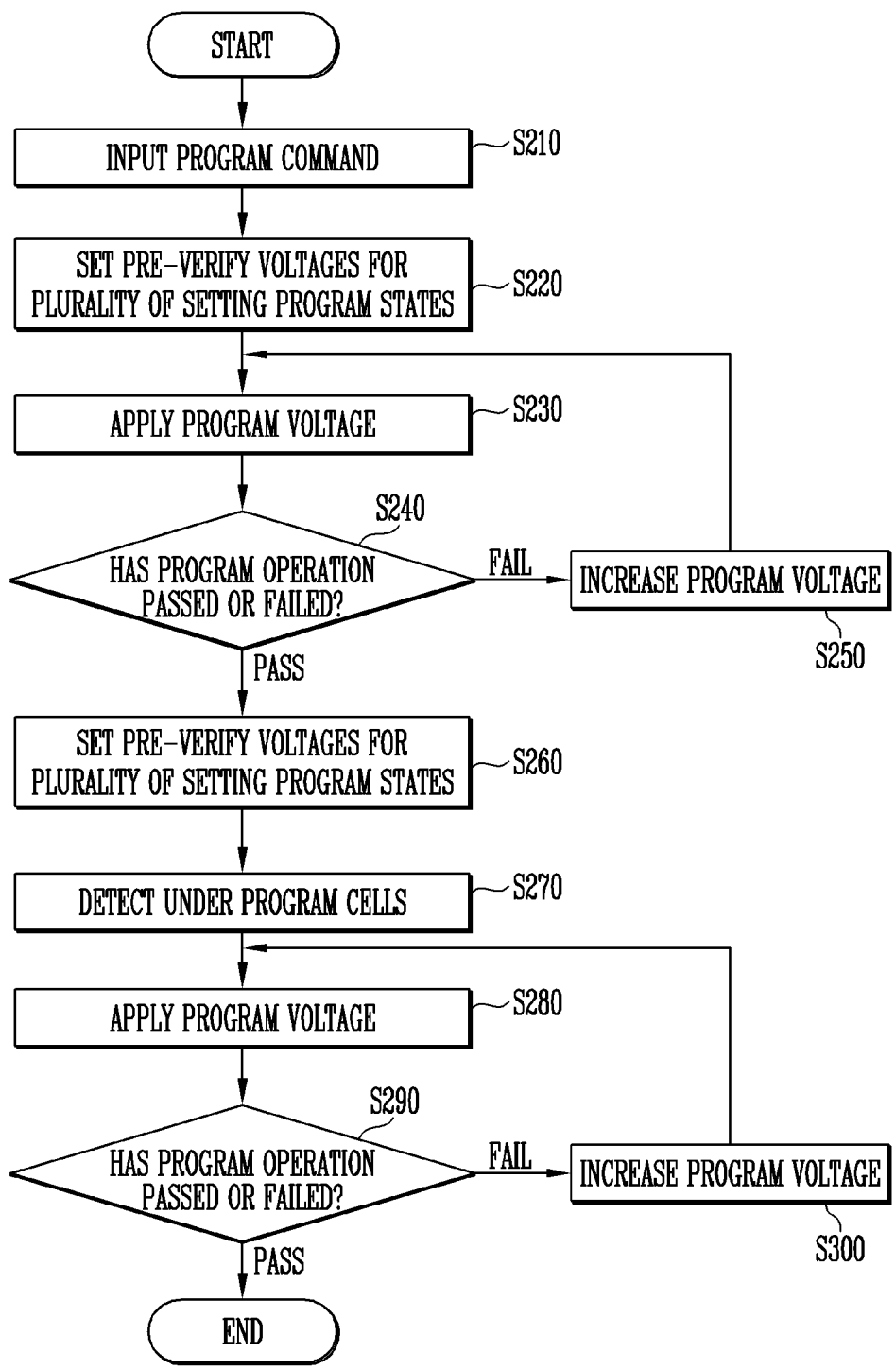
FIG. 6 is a flowchart illustrating an example of an operating method of the semiconductor memory device according to another embodiment of the present disclosure.

FIG. 6 is a flowchart illustrating an example of an operating method of the semiconductor memory device according to another embodiment of the present disclosure.

Figure 7:
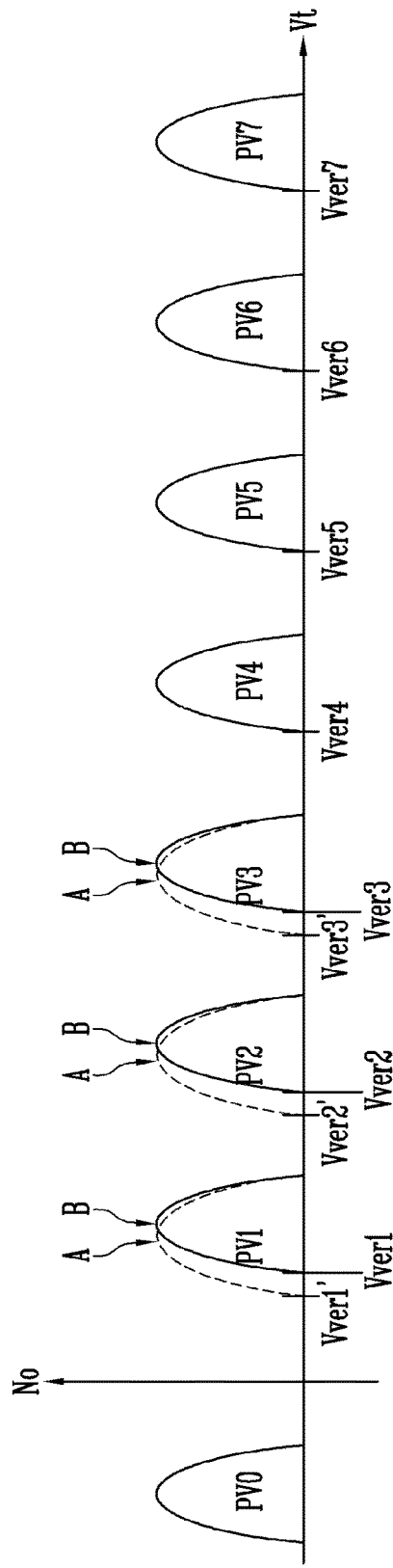
FIG. 7 is a graph illustrating threshold voltage distributions of memory cells in the operating method according to an embodiment of the present disclosure.

FIG. 7 is a graph illustrating threshold voltage distributions of memory cells in the operating method according to an embodiment of the present disclosure.

An operating method of the semiconductor memory device according to another embodiment of the present disclosure will be described as follows with reference to FIGS. 1 to 3, 6 and 7.

In an embodiment of the present disclosure, it is assumed that data is programmed in a triple level cell (TLC) (i.e., it is assumed that a triple level cell programming method is used). However, the present disclosure is not limited thereto, and various embodiments of the present disclosure may be applied to program operations with respect to a multi level cell (MLC) and a quad level cell (QLC). Although it is assumed that only one page having memory cells coupled to one word line WLn adjacent to the drain select line is set as a page subject to the re-program operation, the present disclosure is not limited thereto. That is, the page subject to the re-program operation may be a page that has a vulnerable threshold voltage distribution, and the page subject to the re-program operation may be a page including memory cells adjacent to the drain select transistor and/or a page including memory cells adjacent to the source select transistor. Alternatively, the page subject to the re-program operation may be a plurality of pages including memory cells adjacent to the drain select transistor and/or a plurality of pages including memory cells adjacent to the source select transistor.

If a command CMD for a program operation is input from an external device (S210), the control logic 140 may control the peripheral circuit to perform the program operation of the semiconductor memory device. The read/write circuit 130 temporarily stores data DATA to be programmed, which is input from the external device.

The control logic 140 may perform a re-program operation with respect to at least one program state (e.g., the vulnerable program state), among a plurality of program states, and may control the peripheral circuit to perform a normal program operation with respect to the other program states. Here, the page subject to the re-program operation may be a page including memory cells coupled to a word line WLn adjacent to the drain select line. The control logic 140 may control the voltage generator 150 to set pre-verify voltages for the setting program states in a program operation of the page subject to the re-program operation (S220).

Referring to FIG. 7, a triple level cell (TLC) may be programmed to have one of a plurality of threshold voltage distributions PV0 to PV7 in the program operation. For example, a first threshold voltage distribution PV0 may be an erase state, and second to eighth threshold voltage distributions PV1 to PV7 may be program states (e.g., first to seventh program states). The program operation performed to program memory cells to a plurality of program states (e.g., PV1, PV2, and PV3) having relatively low threshold voltage distributions may be completed before the completion of program operations of the other program states (e.g., PV4 to PV7). As a result, the threshold voltage distribution of the program states PV1, PV2, and PV3 may unintentionally change during the program operation performed to program memory cells to the other program states PV4 and PV7. Therefore, in an embodiment of the present disclosure, the program states PV1, PV2, and PV3, which are vulnerable threshold voltage distributions, may be set as vulnerable program states, and pre-verify voltages Vver1', Vver2', and Vver3' may be set with respect to memory cells to be programmed to the program states PV1, PV2, and PV3. The pre-verify voltages Vver1', Vver2', and Vver3' may be set at a lower voltage level than normal verify voltages Vver1, Vver2, and Vver3 having the same level as a target threshold voltage.

In an embodiment of the present disclosure, the program states PV1, PV2, and PV3 may be set as the vulnerable program states, but the present disclosure is not limited thereto. That is, one or more program states, among the program states PV1 to PV7, may be vulnerable threshold voltage distributions, and may be set as setting program states, and pre-verify voltages may be set the vulnerable program state subject to the re-program operation.

The voltage generator 150 may generate a program voltage Vpgm to be applied to a selected word line and a pass voltage Vpass to be applied to the other word lines (i.e., unselected word lines). The address decoder 120 may apply the program voltage Vpgm to the selected word line and the pass voltage Vpass to the unselected word lines (S230).

The plurality of page buffers PB1 to PBm of the read/write circuit 130 may perform a program verification operation (S240) to verify whether the program operation of each memory cell coupled to the selected word line has been completed. At this time, pre-verify voltages Vver1', Vver2', and Vver3' and normal verify voltages Vver4 to Vver7 may be sequentially applied to the selected word line, and the plurality of page buffers PB1 to PBm may perform the program verification operation by sensing the bit-line potentials or the amount of bit-line current when the pre-verify voltages Vver1', Vver2', and Vver3' and the normal verify voltages Vver4 to Vver7 are applied to measure a threshold voltage of each memory cell.

When it is determined that the program operation of at least one memory cell, among the memory cells coupled to the selected word line, has failed, the program voltage may be increased by a step voltage (S250), and the processes discussed above may be re-performed from the application of the program voltage (S230).

Accordingly, memory cells to be programmed to the first to third program states PV1, PV2, and PV3 among the memory cells coupled to the selected word line may be programmed to have threshold voltage distribution A.

Subsequently, a program operation may be performed on memory cells to be programmed to the remaining program states (i.e., PV4 to PV7).

When it is determined that the program operations of all the memory cells coupled to the selected word line have passed their program verifications using the pre-verify voltages Vver1', Vver2', and Vver3' and the normal verify voltages Vver4 to Vver7, the control logic 140 may set normal verify voltages Vver1, Vver2, and Vver3 for the first to third program states PV1, PV2, and PV3 (S260).

Subsequently, memory cells having threshold voltages lower than each of the normal verify voltages Vver1, Vver2, and Vver3, among the memory cells to be programmed to the first to third program states PV1, PV2, and PV3, may be detected (S270). These operations may be program verification operations that are performed by using the normal verify voltages Vver1, Vver2, and Vver3.

The voltage generator 150 may generate a program voltage Vpgm to be applied to the selected word line and a pass voltage Vpass to be applied to the unselected word lines. The address decoder 120 may apply the program voltage Vpgm to the selected word line and the pass voltage Vpass to the unselected word lines (S280).

Subsequently, a program verification operation may be performed on memory cells to be programmed to the first to third program states using the normal verify voltages Vver1, Vver2, and Vver3 (S290). When it is determined that the program operations of memory cells to be programmed to the first to third program states have failed their program verifications using the normal verify voltages Vver1, Vver2, and Vver3, the program voltage may be increased by a step voltage (S300), and the processes discussed above may be re-performed from the application of the program voltage (S280). Accordingly, the memory cells to be programmed to the first to third program states PV1, PV2, and PV3 may be programmed to have threshold voltage distribution B. That is, the widths of the threshold voltage distributions of the memory cells to be programmed to the first to third program states PV1, PV2, and PV3 may be narrowed from A to B.

In an embodiment of the present disclosure, the other pages may be programmed by a normal program method using an incremental step pulse program (ISPP).

As described above, in an embodiment of the present disclosure, the re-program operation may be performed with respect to program states that are vulnerable the threshold voltage distributions in the subsequent program operation, thereby improving threshold voltage distributions of memory cells. Also, a program operation using the above-described re-program method may be performed on only the predetermined page among the plurality of pages, so that it is possible to reduce the entire program time compared to when the program operation using the re-program method is performed on all the pages.

Figure 8:
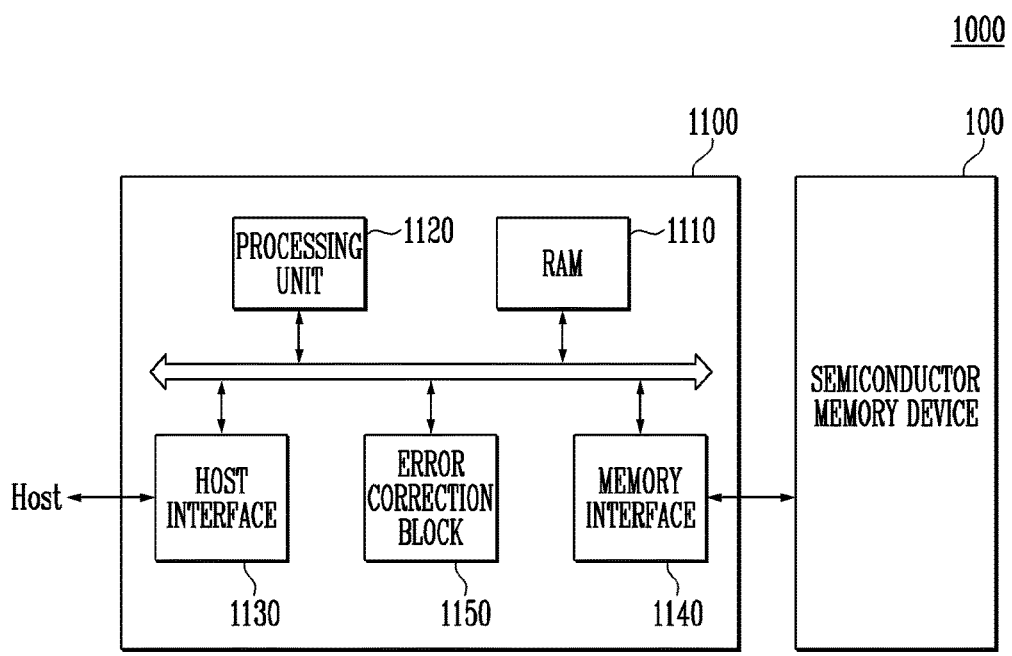
FIG. 8 is a diagram illustrating an example of a memory system including the semiconductor memory device of FIG. 1.

FIG. 8 is a diagram illustrating an example of a memory system including the semiconductor memory device of FIG. 1.

Referring to FIG. 8, the memory system 1000 may include a semiconductor memory device 100 and a controller 1100.

The semiconductor memory device 100 may be similar or identical to the semiconductor memory device described with reference to FIG. 1, and thus any repetitive detailed description will be omitted or simplified.

The controller 1100 may be coupled to a host Host and the semiconductor memory device 100. The controller 1100 may access the semiconductor memory device 100 in response to a request from the host Host. For example, the controller 1100 may control read, write, erase, and background operations of the semiconductor memory device 100.

The controller 1100 may provide an interface between the semiconductor memory device 100 and the host Host. The controller 1100 may drive firmware for controlling the semiconductor memory device 100.

The controller 1100 may include a random access memory (RAM) 1110, a processing unit 1120, a host interface 1130, a memory interface 1140, and an error correction block 1150. The RAM 1110 may be used as at least one of an operation memory of the processing unit 1120, a cache memory between the semiconductor memory device 100 and the host Host, and a buffer memory between the semiconductor memory device 100 and the host Host. The processing unit 1120 may control overall operations of the controller 1100. Also, the controller 1100 may temporarily store program data provided from the host Host in a write operation.

The host interface 1130 may include a protocol for exchanging data between the host Host and the controller 1100. In an example embodiment, the controller 1100 may communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The memory interface 1140 may interface with the semiconductor memory device 100. For example, the memory interface 1140 may include a NAND interface or a NOR interface.

The error correction block 1150 may detect and correct an error of data received from the semiconductor memory device 100 by using an error correction code (ECC). In an example embodiment, the error correction block 1150 may be provided as a component of the controller 1100.

The controller 1100 and the semiconductor memory device 100 may be integrated into one semiconductor device. In an example embodiment, the controller 1100 and the semiconductor memory device 100 may be integrated into a memory card. For example, the controller 1100 and the semiconductor memory device 100 may be integrated into a memory card such as a PC card (personal computer memory card international association (PCMCIA)), a compact flash (CF) card, a smart media card (SM or SMC), a memory stick, a multimedia card (MMC, RS-MMC or MMCmicro), an SD card (SD, miniSD, microSD or SDHC), or a universal flash storage (UFS).

The controller 1100 and the semiconductor memory device 100 may be integrated into a semiconductor drive (e.g., solid state drive (SSD)). The semiconductor drive (e.g., SSD) may include a storage device that stores data in a semiconductor memory.

As another example, the memory system 1000 may be provided as one of various components of an electronic device such as a computer, a ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an example embodiment, the semiconductor memory device 100 or the memory system 1000 may be packaged in various forms. For example, the semiconductor memory device 100 or the memory system 1000 may be packaged in a manner such as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), multi chip package (MCP), wafer-level fabricated package (WFP), or wafer-level processed stack package (WSP).

Figure 9:
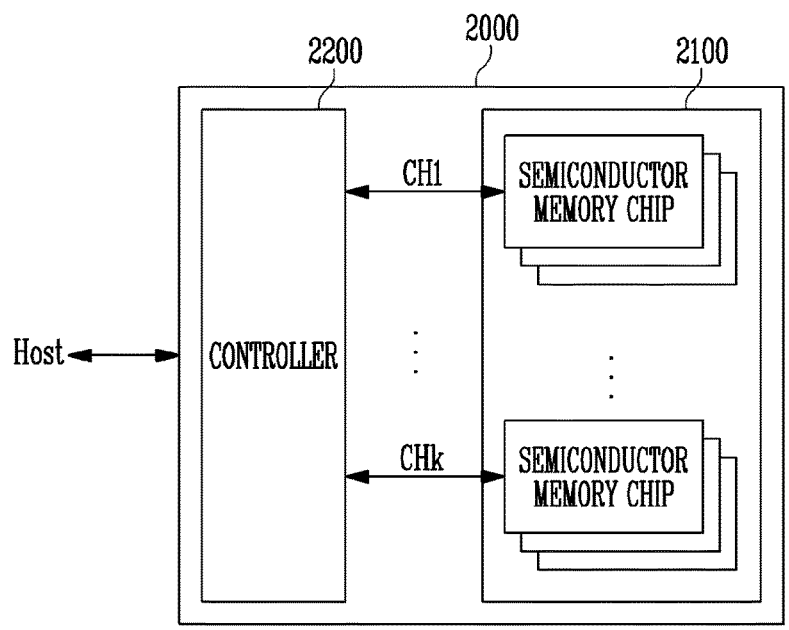
FIG. 9 is a diagram illustrating an application example of the memory system of FIG. 8.

FIG. 9 is a diagram illustrating an application example of the memory system of FIG. 8.

Referring to FIG. 9, the memory system 2000 may include a semiconductor memory device 2100 and a controller 2200. The semiconductor memory device 2100 may include a plurality of semiconductor memory chips. The plurality of semiconductor memory chips may be divided into a plurality of groups.

In FIG. 9, it is illustrated that the plurality of groups communicates with the controller 2200 through first to $k^{th}$ channels CH1 to CHk. Configurations and operations of each semiconductor memory chip may be similar or identical to those of the semiconductor memory device 100 described with reference to FIG. 1.

Each group may communicate with the controller 2200 through a common channel. The controller 2200 may have the same or substantially the same configuration as the controller 1100 described with reference to FIG. 7. The controller 2200 may control the plurality of memory chips of the semiconductor memory device 2100 through the plurality of channels CH1 to CHk.

Figure 10:
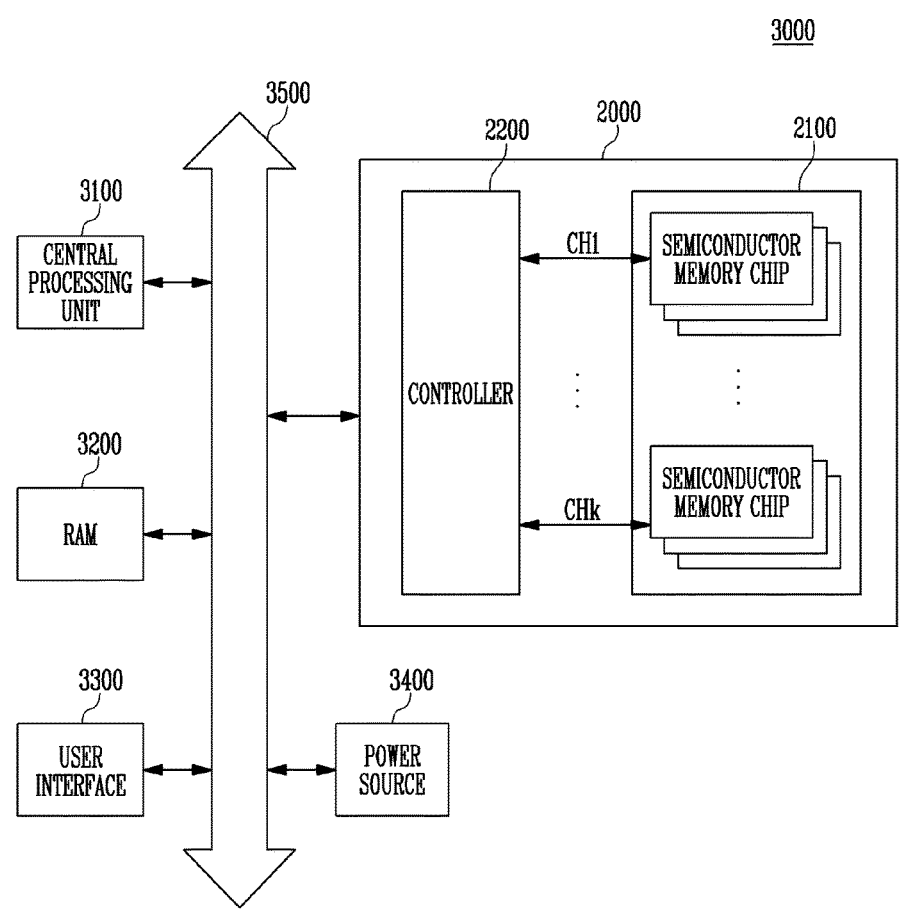
FIG. 10 is a diagram illustrating an example of a computing system including the memory system described with reference to FIG. 9.

FIG. 10 is a diagram illustrating an example of a computing system including the memory system described with reference to FIG. 9.

Referring to FIG. 10, the computing system 3000 may include a central processing unit 3100, a RAM 3200, a user interface 3300, a power source 3400, a system bus 3500, and a memory system 2000.

The memory system 2000 may be electrically coupled to the central processing unit 3100, the RAM 3200, the user interface 3300, and the power source 3400 through the system bus 3500. Data transmitted through user interface 3300 or data processed by the central processing unit 3100 may be stored in the memory system 2000.

In FIG. 10, it is illustrated that the semiconductor memory device 2100 may be coupled to the system bus 3500 through the controller 2200. However, the semiconductor memory device 2100 may be directly coupled to the system bus 3500. In this case, the function of the controller 2200 may be performed by the central processing unit 3100 and the RAM 3200.

In FIG. 10, it is illustrated that the memory system 2000 described with reference to FIG. 9 is provided. However, the memory system 2000 may be replaced by the memory system 1000 described with reference to FIG. 8. In an example embodiment, the computing system 3000 may include both the memory systems 1000 and 2000 described with reference to FIGS. 8 and 9.

According to an embodiment of the present disclosure, it is possible to improve the threshold voltage distribution of memory cells in a program operation of the semiconductor memory device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor memory device, comprising:
a memory cell array including a plurality of memory cells;
a peripheral circuit configured to perform a program operation on the memory cell array;
a control logic configured to control the peripheral circuit to program the memory cell array; and
one or more programs, wherein the one or more programs are configured to be executed by the control logic, the programs including instructions for:
setting first verify voltages for one or more target program states;
programming memory cells coupled to a selected word line using the first verify voltages, each of the memory cells being to be programmed to the one or more target program states;
determining whether the programming of all the memory cells coupled to the selected word line has passed or not;
setting second verify voltages for the one or more target program states, after the programming of all the memory cells coupled to the selected word line has passed; and
re-programming the memory cells coupled to the selected word line using the second verify voltages,
wherein at least one of the second verify voltages is higher than a corresponding verify voltage of the first verify voltages, and
at least another one of the second verify voltages is equal to a corresponding verify voltage of the first verify voltages.

2. The semiconductor memory device of claim 1, wherein the one or more target program states, each of whose second verify voltage is higher than a corresponding first verify voltage, include a program state of which threshold voltage level is the lowest among a plurality of program states.

3. The semiconductor memory device of claim 1, wherein the one or more target program states, each of whose second verify voltage is higher than a corresponding first verify voltage, are one or more program states of which threshold voltage levels are relatively low among a plurality of program states.

4. The semiconductor memory device of claim 1, wherein the one or more target program states, each of whose second verify voltage is higher than a corresponding first verify voltage, are program states that unintentionally change in subsequent program operations with respect to the one or more other target program states.

5. The semiconductor memory device of claim 1, wherein the memory cell array includes a plurality of pages each including the plurality of memory cells, and the control logic perform the re-programming on the memory cells included in predetermined pages among the plurality of pages.

6. The semiconductor memory device of claim 5, wherein the predetermined pages are pages including memory cells adjacent to drain select transistors of the memory cell array.

7. The semiconductor memory device of claim 5, wherein the predetermined pages are a page including memory cells adjacent to the drain select transistors of the memory cell array and a page including memory cells adjacent to source select transistors of the memory cell array.

8. The semiconductor memory device of claim 1, wherein re-programming the memory cells to the one or more target program states includes programming the memory cells, which have been programmed to threshold voltages lower than the one or more target program states, to a threshold voltage distribution of the one or more target program states after the program operation of the memory cells is completed.

9. A method of operating a semiconductor memory device, the method comprising:
providing a page including a plurality of memory cells;
programming the memory cells included in the page using first verify voltages for one or more target program states, each of the memory cells being to be programmed to the one or more target program states;
setting second verify voltages for one or more target program states; and
programming the memory cells included in the page using the second verify voltages,
wherein at least one of the second verify voltages is higher than a corresponding verify voltage of the first verify voltages, and
at least another one of the second verify voltages is equal to a corresponding verify voltage of the first verify voltages.

10. The method of claim 9, wherein the one or more target program states, each of whose second verify voltage is higher than a corresponding first verify voltage, include a program state of which threshold voltage level is lower than the one or more other target program states.

11. The method of claim 9, wherein the one or more target program states, each of whose second verify voltage is higher than a corresponding first verify voltage, are one or more program states of which threshold voltage levels are relatively lower than the one or more other target program states.

12. The method of claim 9, wherein the one or more target program states, each of whose second verify voltage is higher than a corresponding first verify voltage, are program states that unintentionally change in subsequent program operations with respect to the one or more other target program states.

13. The method of claim 9, wherein programming the memory cells included in the page using first verify voltages include:
applying a program voltage to the memory cells; and
performing a program verification operation on the memory cells, using the first verify voltages,
wherein at least one of the first verify voltages is lower than a threshold voltage distribution of a corresponding program state of the one or more target program states.

14. The method of claim 13, wherein programming the memory cells included in the page using first verify voltages includes:

applying the program voltage to the memory cells; and performing the program verification operation on the memory cells, using the second verify voltages, wherein at least one of the second verify voltages is higher than the corresponding verify voltage of the first verify voltages.

15. A method of operating a semiconductor memory device, the method comprising:

providing a plurality of pages each including a plurality of memory cells;

programming the plurality of memory cells included in the plurality of pages using first verify voltages for one or more target program states, each of the plurality of memory cells being to be programmed to the one or more target program states;

setting second verify voltages for one or more target program states; and programming the memory cells included in the pages using the second verify voltages, wherein at least one of the second verify voltages is higher than a corresponding verify voltage of the first verify voltages, and at least another one of the second verify voltages is equal to a corresponding verify voltage of the first verify voltages.

16. The method of claim 15, wherein the pages except predetermined pages are programmed using a normal program method.

17. The method of claim 15, wherein predetermined pages include one or more pages adjacent to source select transistors among the plurality of pages.

18. The method of claim 15, wherein predetermined pages include at least one page adjacent to drain select transistors and at least one page adjacent to the source select transistors among the plurality of pages.

19. The method of claim 15, wherein the one or more target program states include a program state of which threshold voltage level is lower than the one or more other target program states.

20. The method of claim 15, wherein programming the plurality of memory cells included in the plurality of pages using first verify voltages includes:

applying a program voltage to the memory cells; and performing a program verification operation on the memory cells, using the first verify voltages, wherein at least one of the first verify voltages is lower than a threshold voltage distribution of a corresponding program state of the one or more target program states.

* * * * *